(12) United States Patent
Coreth et al.

(10) Patent No.: US 11,876,246 B2
(45) Date of Patent: Jan. 16, 2024

(54) DETECTOR FOR EARLY DETECTION OF BATTERY FIRE AND/OR AN OVERHEATED CONDITION IN A BATTERY

(71) Applicant: Kidde Technologies, Inc., Wilson, NC (US)

(72) Inventors: Stefan Coreth, Roanoke Rapids, NC (US); Terry Simpson, Wake Forest, NC (US); Amanda J. Daly, Cary, NC (US); Sandip Dhanani, Knightdale, NC (US)

(73) Assignee: KIDDE TECHNOLOGIES, INC., Wilson, NC (US)

( * ) Notice: Subject to any disclaimer, the term of this patent is extended or adjusted under 35 U.S.C. 154(b) by 8 days.

(21) Appl. No.: 17/532,370

(22) Filed: Nov. 22, 2021

(65) Prior Publication Data
US 2022/0085454 A1    Mar. 17, 2022

Related U.S. Application Data

(62) Division of application No. 16/514,648, filed on Jul. 17, 2019, now Pat. No. 11,183,733.

(51) Int. Cl.
| | |
|---|---|
| *H01M 50/383* | (2021.01) |
| *H01M 50/30* | (2021.01) |
| *H01M 10/48* | (2006.01) |
| *G01R 31/396* | (2019.01) |
| *G01R 31/382* | (2019.01) |

(52) U.S. Cl.
CPC ........ *H01M 50/383* (2021.01); *G01R 31/382* (2019.01); *G01R 31/396* (2019.01); *H01M 10/48* (2013.01); *H01M 10/482* (2013.01); *H01M 10/486* (2013.01); *H01M 50/394* (2021.01)

(58) Field of Classification Search
CPC .... H01M 50/12; H01M 10/525; H01M 10/48; H01M 50/20
See application file for complete search history.

(56) References Cited

U.S. PATENT DOCUMENTS

| | | |
|---|---|---|
| 9,472,079 B2 | 10/2016 | Meier |
| 9,835,549 B1 | 12/2017 | Erdtmann |
| 10,107,867 B2 | 10/2018 | Elian et al. |

(Continued)

FOREIGN PATENT DOCUMENTS

| | | |
|---|---|---|
| CN | 108790828 A | 11/2018 |
| EP | 2289720 A1 | 3/2011 |

OTHER PUBLICATIONS

European Search Report Application No. 19212857.7; dated Jul. 7, 2020; pp. 6.

*Primary Examiner* — Kenneth J Douyette
(74) *Attorney, Agent, or Firm* — CANTOR COLBURN LLP

(57) ABSTRACT

A fire and/or overheated condition detector for a lithium ion battery is provided. The fire and/or overheated condition detector includes a chamber defining a detection space fluidly communicative with an interior of the lithium ion battery, a temperature sensor operably disposed proximate to the detection space, gas detection assemblies configured to detect gases through absorption in the detection space and a smoke detection assembly configured to detect particle scattering in the detection space to discriminate smoke particles from nuisance particles.

9 Claims, 3 Drawing Sheets

(56) References Cited

U.S. PATENT DOCUMENTS

| | | | |
|---|---|---|---|
| 2007/0285262 A1* | 12/2007 | Lax | G08B 17/10 340/628 |
| 2012/0312562 A1 | 12/2012 | Woehrle et al. | |
| 2016/0336623 A1 | 11/2016 | Nayar et al. | |

* cited by examiner

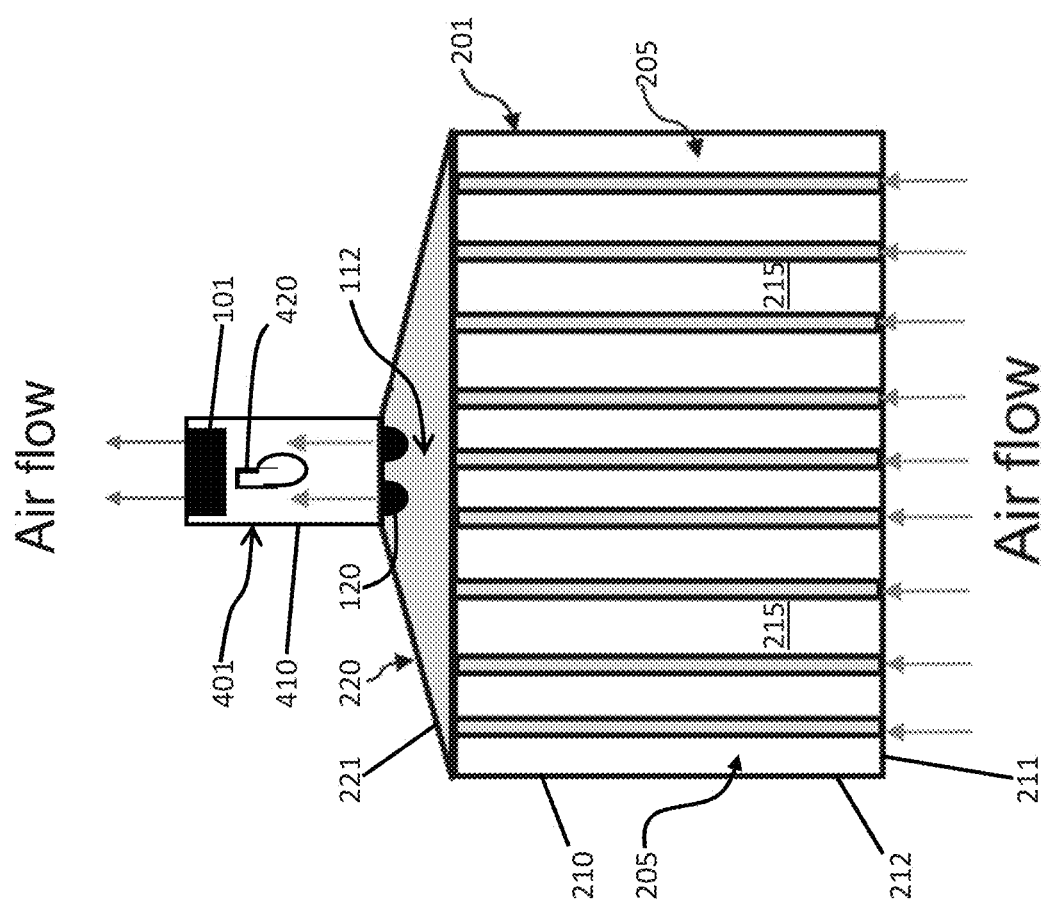

DETECTOR FOR EARLY DETECTION OF BATTERY FIRE AND/OR AN OVERHEATED CONDITION IN A BATTERY

CROSS-REFERENCE TO RELATED APPLICATIONS

This application is a division of U.S. application Ser. No. 16/514,648 filed Jul. 17, 2019, now U.S. Pat. No. 11,183,733, the disclosure of which is incorporated herein by reference in its entirety.

BACKGROUND

The following description relates to detectors and, more specifically, to a multi-criteria detector for early detection of a fire or an overheated condition in a lithium ion battery.

A lithium ion battery is a rechargeable battery and typically includes a volumetric body in which an electrolyte is provided between positive electrode plates and negative electrode plates. The positive electrode plates can be interleaved between the negative electrode plates in a face-to-face arrangement. When the battery is being discharged, lithium ions move from the negative electrode to the positive electrode. During recharging, the lithium ions move back to the negative electrode.

An ongoing issue with certain lithium ion batteries is their tendency to overheat and catch fire. When this happens, the fire can damage the lithium ion battery as well as the surrounding objects (i.e., components of an electric vehicle or an airplane). As such, despite recent progress and improvement in lithium ion battery safety features, fire suppression systems for use with lithium ion batteries are and remain useful.

Even with effective fire suppression, the early detection of lithium ion battery fires is a major key to suppression.

BRIEF DESCRIPTION

According to an aspect of the disclosure, a fire and/or overheated condition detector for a lithium ion battery is provided. The fire and/or overheated condition detector includes a chamber defining a detection space fluidly communicative with an interior of the lithium ion battery, a temperature sensor operably disposed proximate to the detection space, gas detection assemblies configured to detect gases through absorption in the detection space and a smoke detection assembly configured to detect particle scattering in the detection space to discriminate smoke particles from nuisance particles.

In accordance with additional or alternative embodiments, an entrance to the detection space is fluidly interposed between the interior of the lithium ion battery and the detection space and the temperature sensor includes one or more temperature sensors operably disposed in the entrance to the detection space.

In accordance with additional or alternative embodiments, the gas detection assemblies include a hydrogen fluoride (HF) gas detection assembly and the HF gas detection assembly includes a light source configured to emit light having a wavelength range of about 2.0-3.0 μm through the detection space and a photodetector configured to detect the light having the wavelength range of about 2.0-3.0 μm.

In accordance with additional or alternative embodiments, the light source includes a 2.6 μm light source.

In accordance with additional or alternative embodiments, the gas detection assemblies include a carbon dioxide (CO2) gas detection assembly and the CO2 gas detection assembly includes a light source configured to emit light having a wavelength range of about 4.0-4.6 μm through the detection space and a photodetector configured to detect the light having the wavelength range of about 4.0-4.6 μm.

In accordance with additional or alternative embodiments, the light source includes a 4.3 μm light source.

In accordance with additional or alternative embodiments, the smoke detection assembly includes first and second light sources configured to emit light having wavelength ranges of about 0.3-0.5 μm and about 0.7-1.0 μm through the detection space and a photodetector configured to detect the light having the wavelength ranges of about 0.3-0.5 μm and about 0.7-1.0 μm.

In accordance with additional or alternative embodiments, the first light source includes an ultraviolet (UV) light source and the second light source includes an infrared (IR) light source.

In accordance with additional or alternative embodiments, the smoke detection assembly further includes a mirror optically interposed between the first and second light sources and the photodetector and the mirror is disposed at an opposite end of the chamber from the first and second light sources and the photodetector.

In accordance with additional or alternative embodiments, the gas detection assemblies include a volatile organic compound gas detection assembly including a UV source and emitter or a metal oxide semiconductor sensor.

In accordance with additional or alternative embodiments, a controller is coupled to each of the temperature sensor, the gas detection assemblies and the smoke detection assembly and the controller is configured to execute early fire and/or overheat detection while retaining nuisance discrimination based on readings of the temperature sensor, the gas detection assemblies and the smoke detection assembly.

According to an aspect of the disclosure, a lithium ion battery is provided and includes a body defining an interior in which a lithium ion battery cell is disposable, a fire and/or overheated condition detector, a shroud and a controller. The fire and/or overheated condition detector includes a chamber defining a detection space, a temperature sensor proximate to the detection space, gas detection assemblies configured to detect gases through absorption in the detection space and a smoke detection assembly configured to detect particle scattering in the detection space to discriminate smoke particles from nuisance particles. The shroud is attached to the body and configured to direct gases, smoke particles and nuisance particles from the interior of the body toward the fire and/or overheated condition detector. The controller is configured to execute early fire and/or overheated condition detection while retaining nuisance discrimination based on readings of the temperature sensor, the gas detection assemblies and the smoke detection assembly.

In accordance with additional or alternative embodiments, the fire and/or overheated condition detector is receptive of power from the lithium ion battery cell.

In accordance with additional or alternative embodiments, the body defines one or more interiors in each of which one or more lithium ion battery cells are disposable and the shroud is configured to direct gases, smoke particles and nuisance particles from each of the one or more interiors of the body toward the fire and/or overheated condition detector.

In accordance with additional or alternative embodiments, the controller is remote from the fire and/or overheated condition detector and receptive of the readings via wireless communications.

According to an aspect of the disclosure, a lithium ion battery is provided and includes a body defining an interior in which a lithium ion battery cell is disposable, a remote fire and/or overheated condition detector, a shroud and a controller. The remote fire and/or overheated condition detector includes a chamber defining a detection space, a temperature sensor proximate to the detection space, gas detection assemblies configured to detect gases through absorption in the detection space and a smoke detection assembly configured to detect particle scattering in the detection space to discriminate smoke particles from nuisance particles. The shroud assembly is attached to the body and configured to direct gases, smoke particles and nuisance particles from the interior of the body toward the remote fire and/or overheated condition detector. The controller is configured to execute early fire and/or overheated condition detection while retaining nuisance discrimination based on readings of the temperature sensor, the gas detection assemblies and the smoke detection assembly.

In accordance with additional or alternative embodiments, the fire and/or overheated condition detector is receptive of power from the lithium ion battery cell.

In accordance with additional or alternative embodiments, the shroud assembly includes a ducting apparatus configured to drive flows toward the remote fire and/or overheated condition detector.

In accordance with additional or alternative embodiments, the body defines one or more interiors in each of which one or more lithium ion battery cells are disposable and the shroud assembly is configured to direct gases, smoke particles and nuisance particles from each of the one or more interiors of the body toward the fire and/or overheated condition detector.

In accordance with additional or alternative embodiments, the controller is remote from the remote fire and/or overheated condition detector and receptive of the readings via wireless communications.

These and other advantages and features will become more apparent from the following description taken in conjunction with the drawings.

BRIEF DESCRIPTION OF THE DRAWINGS

The subject matter, which is regarded as the disclosure, is particularly pointed out and distinctly claimed in the claims at the conclusion of the specification. The foregoing and other features and advantages of the disclosure are apparent from the following detailed description taken in conjunction with the accompanying drawings in which:

FIG. 4 is a side view of a lithium ion battery in accordance with further embodiments.

These and other advantages and features will become more apparent from the following description taken in conjunction with the drawings.

DETAILED DESCRIPTION

As will be described below, an early fire and/or overheated condition detector is provided for use with a lithium ion battery and detects combinations of volatile organic compounds (VOCs), hydrogen fluoride (HF) and carbon dioxide ($CO_2$) gases, smoke particulates and a local temperature rise. Any combination of these criteria can be useful in signifying or identifying a start of a lithium ion battery fire and/or an overheated condition of a lithium ion battery.

The early detection is achieved using a chambered detector with a detection area inside of the chambered detector. This detection area is capable of detecting the presence of VOCs, HF gas, $CO_2$ gas, smoke particles and a local temperature rise. A first light source, one or more optical path lengths and a photodetector are designed to detect HF gas through absorption, a second light source, one or more optical path lengths and a photodetector are designed to detect $CO_2$ gas through absorption and third light sources, one or more optical path lengths and a photodetector are designed to detect the scattering of particles in a detection space to discriminate smoke from nuisance alarms. Semiconductor metal oxide sensors or other types of sensors can be used to detect the VOCs or VOC gases, such as ethylene methylene carbonate (EMC), dimethylene carbonate (DMC), diethylene carbonate (DEC) and propylene carbonate (PC). Electrical-type temperature sensors or other temperature sensors can be used to detect a local temperature rise.

Figure 1:
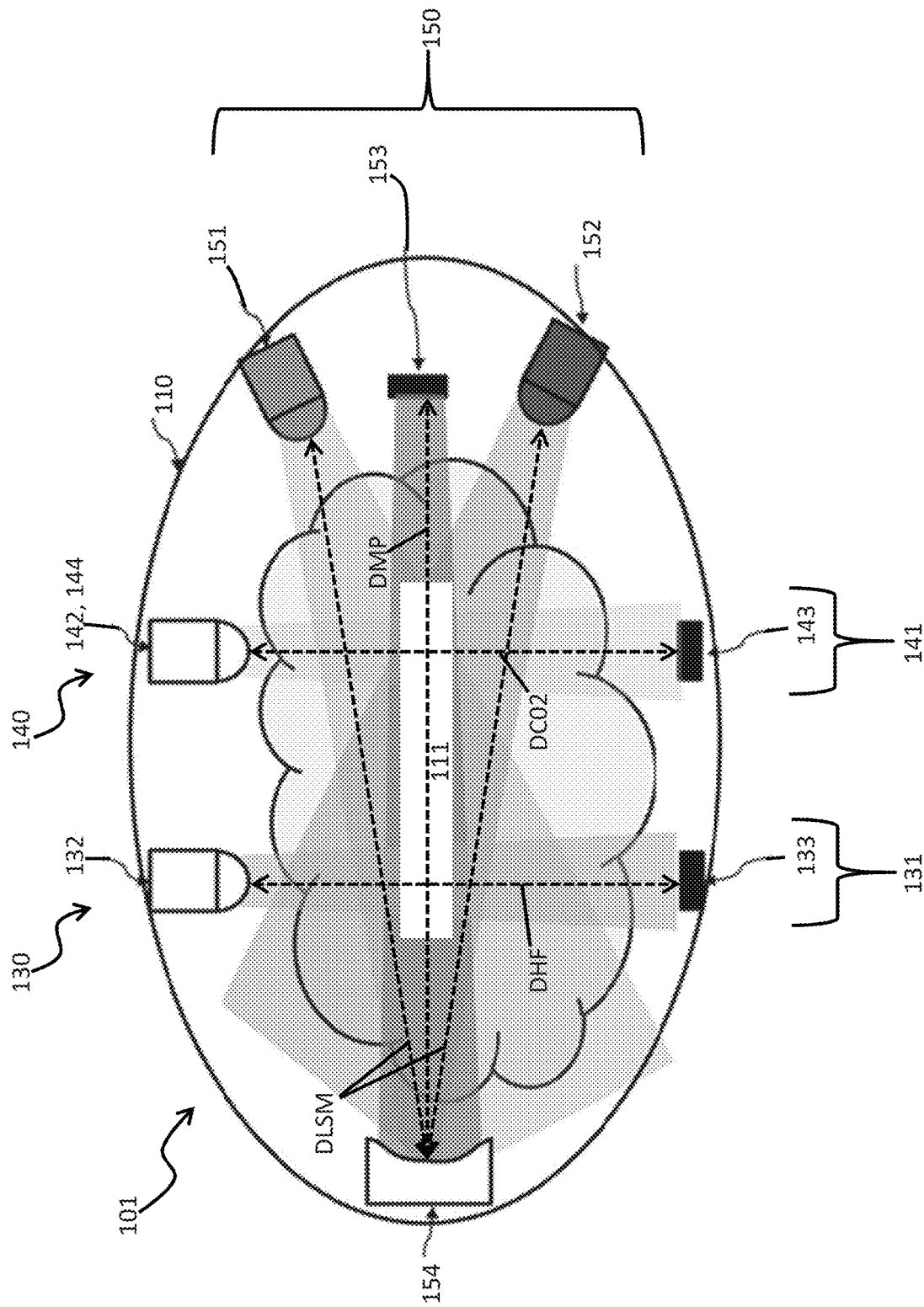
FIG. 1 is a schematic diagram of a fire and/or overheated condition detector in accordance with embodiments.
Figure 2:
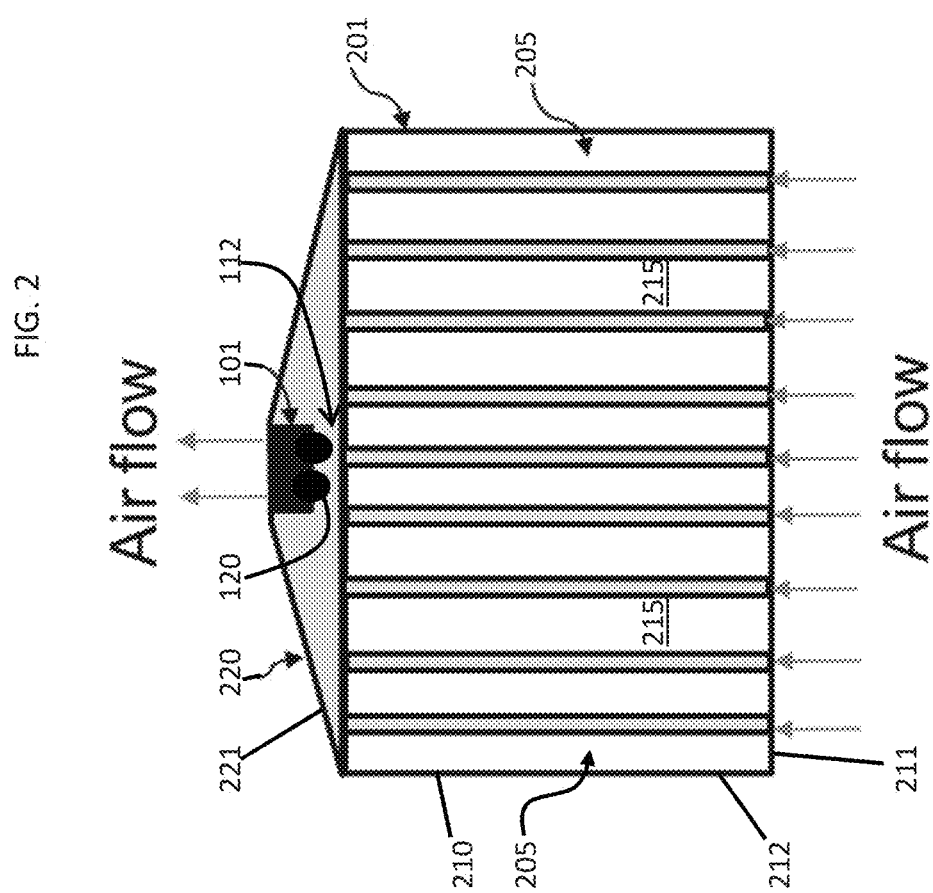
FIG. 2 is a side view of a lithium ion battery rack in accordance with embodiments.

With reference to FIGS. 1 and 2, a fire and/or overheated condition detector 101 is provided for use with a lithium ion battery rack 201, for example. As shown in FIG. 2, the lithium ion battery rack 201 includes one or more lithium ion battery cells 205 and a volumetric body 210. The volumetric body 210 has a bottom portion 211, sidewalls 212 and a shroud assembly 220 that is supported above the bottom portion 211 by the sidewalls 212 such that the volumetric body 210 defines one or more interiors 215. The one or more lithium ion battery cells 205 are respectively disposable in the one or more interiors 215 and can each include multiple lithium ion batteries that, in turn, include positive and negative electrode plates that exchange lithium ions during charging and discharging operations via an electrolytic solution to generate electricity.

During operations of the one or more lithium ion battery cells 205, each of the multiple lithium ion batteries of each of the one or more lithium ion battery cells 205 can overheat and potentially catch fire under certain circumstances. In these or other cases, each of the multiple lithium ion batteries of each of the one or more lithium ion battery cells 205 will produce and give off gases, such as VOCs, hydrogen fluoride (HF) and carbon dioxide ($CO_2$), and smoke particles in some cases. The detection of these gases is a key factor in early detection of a fire and/or an overheated condition.

The fire and/or overheated condition detector 101 can be local to the lithium ion battery rack 201 (see FIG. 2) or remote from the lithium ion battery rack 201 (see FIG. 4). In either case, the shroud assembly 220 is attachable to the sidewalls 212 of the volumetric body 210 and is configured to direct the gases and smoke particles that can be produced and given off by the one or more lithium ion battery cells 205 prior to and during a fire and/or an overheated condition as well as nuisance particles from the interior 215 and toward the fire and/or overheated condition detector 101.

The shroud assembly 220 can include a shallow tapered, lithium ion battery ceiling 221. Where the lithium ion battery rack 201 is generally in its normally upright orientation, the shallow tapered, lithium ion battery ceiling 221 directs the gases and smoke particles that can be produced by each of the one or more lithium ion battery cells 205 prior to and during a fire and/or overheated condition as well as nuisance particles from the interior 215 to rise and flow inwardly toward the fire and/or overheated condition detector 101. In cases where the fire and/or overheated condition detector 101 is local (see FIG. 2), the shallow tapered, lithium ion battery ceiling 221 can be closed around a periphery of the fire and/or overheated condition detector 101. In cases where the fire and/or overheated condition detector 101 is remote (see FIG. 4), the shallow tapered, lithium ion battery ceiling 221 can be opened as described below.

As shown in FIGS. 1 and 2, the fire and/or overheated condition detector 101 includes a chamber 110, a temperature sensor 120 (see FIG. 2), gas detection assemblies 130 and 140 and a smoke detection assembly 150. The chamber 110 is formed to define an interior with a detection space 111 that is fluidly communicative with the one or more interiors 215 (see FIG. 2). The temperature sensor 120 can include or be provided as a temperature sensor of an electronic-type and can be provided as one or more temperature sensors 120 operably disposed proximate to the detection space 111. More particularly, multiple temperature sensors 120 can be operably disposed in the entrance 112 to the detection space 111, which is fluidly interposed between the one or more interiors 215 and the detection space 111, for redundancy. The gas detection assemblies 130 and 140 are each configured to detect gases produced and given off by the one or more lithium ion battery cells 205 during a fire and/or an overheated condition through absorption of the gases in the detection space 111. The smoke detection assembly 150 is configured to detect particle scattering in the detection space 111 to discriminate between smoke particles produced by the one or more lithium ion battery cells 205 during a fire from nuisance particles.

The gas detection assembly 130 can include or be provided as an HF gas detection assembly 131. In such cases, the HF gas detection assembly 131 includes a light source 132 that is configured to emit light, which has a wavelength range of about 2.0-3.0 µm, through the detection space 111 and a photodetector 133 that is configured to detect the light incident thereon. In accordance with embodiments, the light source 132 can include or be provided as a 2.6 µm light source. With this construction, the HF gas detection assembly 131 is capable of detecting an intensity of the light that is incident on the photodetector 133 such that, if an emission intensity of the light source 132 is known and a distance DHF between the light source 132 and the photodetector 133 is known, a degree of absorption of the light by gases (i.e., HF gas) in the detection space 111 can be determined. This determination can then be used in a further determination as to whether a fire and/or an overheated condition incident in the one or more lithium ion battery cells 205 is in effect.

The gas detection assembly 140 can include or be provided as a CO2 gas detection assembly 141. In such cases, the CO2 gas detection assembly 141 includes a light source 142 that is configured to emit light, which has a wavelength range of about 4.0-4.6 µm, through the detection space 111 and a photodetector 143 that is configured to detect the light incident thereon. In accordance with embodiments, the light source 142 can include or be provided as a 4.3 µm light source. With this construction, the CO2 gas detection assembly 141 is capable of detecting an intensity of the light that is incident on the photodetector 143 such that, if an emission intensity of the light source 142 is known and a distance DCO2 between the light source 142 and the photodetector 143 is known, a degree of absorption of the light by gases (i.e., CO2 gas) in the detection space 111 can be determined. This determination can then be used in a further determination as to whether a fire and/or an overheated condition incident in the one or more lithium ion battery cells 205 is in effect.

Alternatively, the gas detection assembly 140 could detect VOC compounds via a UV emitter and a sensor arrangement as above or a metal oxide semiconductor sensor 144.

The smoke detection assembly 150 can include a first light source 151 that is configured to emit light having a wavelength range of about 0.3-0.5 µm through the detection space 111, a second light source 152 that is configured to emit light having a wavelength range of about 0.7-1.0 µm through the detection space 111 and a photodetector 153. In accordance with embodiments, the first light source can include or be provided as an ultraviolet (UV) light source and the second light source can include or be provided as an infrared (IR) light source. In accordance with further embodiments, the smoke detection assembly 150 can further include a mirror 154. The mirror 154 is optically interposed between the first and second light sources 151 and 152 and the photodetector 153. The mirror 154 is thus positioned and configured to reflect a quantity of the light emitted by each of the first and second light sources 151 and 152 toward the photodetector 153. The photodetector 153 is configured to detect the light from both the first light source 151 and the second light source 152, which is incident thereon after having been reflected by the mirror 154. With this construction, the smoke detection assembly 150 is capable of detecting an intensity of the light that is incident on the photodetector 153 from either the first or the second light sources 151 and 152 such that, if an emission intensity of the first and second light sources 151 and 152 are known and distances DLSM between the first and second light sources 151 and 152 and the mirror 154 and distances DMP between the mirror 154 and the photodetector 153 are known, a degree of scattering of the light by smoke particles in the detection space 111 can be determined. This determination can then be used in a further discriminatory determination as to whether a fire and/or an overheated condition incident in the one or more lithium ion battery cells 205 is in effect as opposed to a nuisance.

Figure 3:
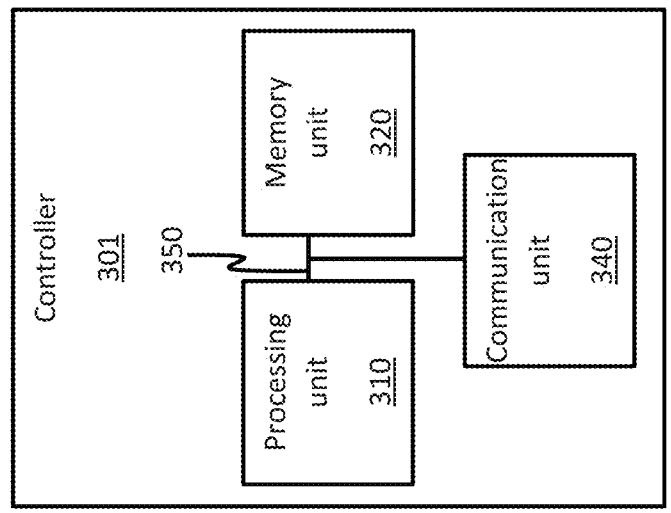
FIG. 3 is a schematic diagram of a controller of the fire and/or overheated condition detector or the lithium ion battery of FIGS. 1 and 2 in accordance with embodiments.

With continued reference to FIGS. 1 and 2 and with additional reference to FIG. 3, a controller 301 can be provided as a component of the fire and/or overheated condition detector 101 as shown in FIG. 1 or as a component of the lithium ion battery rack 201 as shown in FIG. 2 (and FIG. 4). In any case, the controller 301 is operably coupled to and disposed in signal communication with each of the temperature sensor 120, the HF and CO2 (or CO2/VOC) gas detection assemblies 131 and 141 and the smoke detection assembly 150. The controller 301 is provided with logic that can execute a multi-criteria algorithm and, as such, the controller 301 is configured to execute early fire and/or overheated condition detection while retaining nuisance discrimination based on readings of various combinations of one or more of the temperature sensor 120, the HF and CO2/VOC gas detection assemblies 131 and 141 and the smoke detection assembly 150.

Single processing to discriminate nuisance alarm sources or gases present in normal operations and real lithium ion battery failure events is a key to the performance of the controller 301 and the overall systems disclosed herein.

As shown in FIG. 3, the controller 301 includes a processing unit 310, a memory unit 320, a communication unit 340 and an input/output (I/O) bus 350. A servo control unit can be provided to allow the processing unit 310 to control certain operations of certain components (i.e., light sources)

of the HF and CO2 (or the CO2/VOC) gas detection assemblies 131 and 141 and the smoke detection assembly 150. The communication unit 340 allows the processing unit 310 to communicate via wired connections (in the case of the controller 301 being local to the fire and/or overheated condition detector 101 or the lithium ion battery rack 201) or via wireless connections (in the case of the controller 301 being remote from the fire and/or overheated condition detector 101 or the lithium ion battery rack 201) with the temperature sensor 120 and with certain components (i.e., the photodetectors) of the HF and CO2 (or the CO2/VOC) gas detection assemblies 131 and 141 and the smoke detection assembly 150. The I/O bus 350 provides for communications and interconnectivity between the processing unit 310, the memory unit 320 and the communications unit 340. The memory unit 320 has executable instructions stored thereon, which are readable and executable by the processing unit 310. When they are read and executed by the processing unit 310, the executable instructions cause the processing unit 310 to operate as described herein.

For example, when they are read and executed by the processing unit 310, the executable instructions cause the processing unit 310 to command the light sources of the HF and CO2 (or the CO2/VOC) gas detection assemblies 131 and 141 and the smoke detection assembly 150 to emit light through the detection space 111 and to communicate, via the communication unit 340, with the temperature sensor 120 and with the photodetectors of the HF and CO2 gas detection assemblies 131 and 141 and the smoke detection assembly 150 such that the processing unit 310 is receptive of the readings of the photodetectors (alternatively, UV emitters and photodetectors could be used as above to detect VOCs or metal oxide semiconductor sensors 144). Additionally, when they are read and executed by the processing unit 310, the executable instructions further cause the processing unit 310 to determine from any combinations of these readings whether a fire and/or an overheated condition incident in the one or more lithium ion battery cells 205 is in effect as opposed to a nuisance.

With reference back to FIG. 2, the fire and/or overheated condition detector 101 is local with respect to the lithium ion battery rack 201 and the shallow tapered, lithium ion battery ceiling 221 of the shroud assembly 220 is closed around a periphery of the fire and/or overheated condition detector 101 (airflow through the fire and/or overheated condition detector 101 is possible). In these or other cases, the fire and/or overheated condition detector 101 can be receptive of power from the one or more lithium ion battery cells 205.

With reference to FIG. 4, the lithium ion battery rack 201 is provided generally as described above but with the fire and/or overheated condition detector 101 being remote (i.e., a remote fire and/or overheated condition detector 101) from the body 210. As shown in FIG. 4, the shallow tapered, lithium ion battery ceiling 221 of the shroud assembly 220 is open and the shroud assembly 220 can further include a ducting apparatus 401. This ducting apparatus 401 provides for fluid communication between the opening of the shallow tapered, lithium ion battery ceiling 221 and the remote fire and/or overheated condition detector 101 and includes a duct 410 and, in some cases, a blower or fan element 420 that can drive flows from the one or more lithium ion battery cells 205 through the opening of the shallow tapered, lithium ion battery ceiling 221, through the duct 410 and to the remote fire and/or overheated condition detector 101.

While the blower or fan element 420 has been described above as being a component of the embodiments of FIG. 4, it is to be understood that the blower or fan element 420 can also be employed in the embodiments of FIG. 2. It is to be understood that, in both sets of embodiments, the blower or fan element 420 can drive flows to the fire and/or overheated condition detector 101/remote fire and/or overheated condition detector 101 such that the fire and/or overheated condition detector 101/remote fire and/or overheated condition detector 101 can be operative in various conditions such as when the lithium ion battery rack 201 is tipped over or upside down (i.e., due to an accident).

Technical effects and benefits of the enclosure design of the present disclosure are the provision of a detector specifically useful for early detection of lithium ion battery fires. While, typical remotely mounted thermal or smoke detectors will tend to react too slowly to a lithium ion battery fire and/or overheated condition and thus allow the fire to grow to an uncontrollable size, the detector described herein responds fast enough to allow for fire suppression or mitigation before the fire grows to the uncontrollable size without a substantial risk of false alarms.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A lithium ion battery, comprising:
a body defining an interior in which a lithium ion battery cell is disposable;
a fire and/or overheated condition detector comprising a chamber defining a detection space, a temperature sensor proximate to the detection space, gas detection assemblies configured to detect gases through absorption in the detection space and a smoke detection assembly configured to detect particle scattering in the detection space to discriminate smoke particles from nuisance particles;
a shroud attached to the body and configured to direct gases, smoke particles and nuisance particles from the interior of the body toward the fire and/or overheated condition detector; and
a controller configured to execute early fire and/or overheated condition detection while retaining nuisance discrimination based on readings of the temperature sensor, the gas detection assemblies and the smoke detection assembly,
each gas detection assembly comprises a light source at a first side of the detection space and a photodetector at a second side of the detection space, and
the smoke detection assembly comprises first and second light sources and a photodetector at a first end of the detection space and a mirror optically interposed between the first and second light source and the photodetector at a second end of the detection space.

2. The lithium ion battery according to claim 1, wherein the fire and/or overheated condition detector is receptive of power from the lithium ion battery cell.

3. The lithium ion battery according to claim 1, wherein:
the body defines one or more interiors in each of which one or more lithium ion battery cells are disposable, and
the shroud is configured to direct gases, smoke particles and nuisance particles from each of the one or more interiors of the body toward the fire and/or overheated condition detector.

4. A lithium ion battery, comprising:
a body defining an interior in which a lithium ion battery cell is disposable;
a fire and/or overheated condition detector comprising a chamber defining a detection space, a temperature sensor proximate to the detection space, gas detection assemblies configured to detect gases through absorption in the detection space and a smoke detection assembly configured to detect particle scattering in the detection space to discriminate smoke particles from nuisance particles;
a shroud attached to the body and configured to direct gases, smoke particles and nuisance particles from the interior of the body toward the fire and/or overheated condition detector; and
a controller remote from the fire and/or overheated condition detector and configured to execute early fire and/or overheated condition detection while retaining nuisance discrimination based on wirelessly received readings of the temperature sensor, the gas detection assemblies and the smoke detection assembly,
each gas detection assembly comprises a light source at a first side of the detection space and a photodetector at a second side of the detection space, and
the smoke detection assembly comprises first and second light sources and a photodetector at a first end of the detection space and a mirror optically interposed between the first and second light source and the photodetector at a second end of the detection space.

5. A lithium ion battery, comprising:
a body defining an interior in which a lithium ion battery cell is disposable;
a remote fire and/or overheated condition detector comprising a chamber defining a detection space, a temperature sensor proximate to the detection space, gas detection assemblies configured to detect gases through absorption in the detection space and a smoke detection assembly configured to detect particle scattering in the detection space to discriminate smoke particles from nuisance particles;
a shroud assembly attached to the body and configured to direct gases, smoke particles and nuisance particles from the interior of the body toward the remote fire and/or overheated condition detector; and
a controller configured to execute early fire and/or overheated condition detection while retaining nuisance discrimination based on readings of the temperature sensor, the gas detection assemblies and the smoke detection assembly,
each gas detection assembly comprises a light source at a first side of the detection space and a photodetector at a second side of the detection space, and
the smoke detection assembly comprises first and second light sources and a photodetector at a first end of the detection space and a mirror optically interposed between the first and second light source and the photodetector at a second end of the detection space.

6. The lithium ion battery according to claim 5, wherein the remote fire and/or overheated condition detector is receptive of power from the lithium ion battery cell.

7. The lithium ion battery according to claim 5, wherein the shroud assembly comprises a ducting apparatus configured to drive flows toward the remote fire and/or overheated condition detector.

8. The lithium ion battery according to claim 5, wherein:
the body defines one or more interiors in each of which one or more lithium ion battery cells are disposable, and
the shroud assembly is configured to direct gases, smoke particles and nuisance particles from each of the one or more interiors of the body toward the remote fire and/or overheated condition detector.

9. The lithium ion battery according to claim 5, wherein the controller is remote from the remote fire and/or overheated condition detector and receptive of the readings via wireless communications.

* * * * *